United States Patent
Mieno

(10) Patent No.: US 9,425,278 B2
(45) Date of Patent: Aug. 23, 2016

(54) SEGREGATED FINFET STRUCTURE AND MANUFACTURING METHOD

(71) Applicant: SEMICONDUCTOR MANUFACTURING INTERNATIONAL (SHANGHAI) CORPORATION, Shanghai (CN)

(72) Inventor: Fumitake Mieno, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/502,912

(22) Filed: Sep. 30, 2014

(65) Prior Publication Data

US 2015/0364594 A1    Dec. 17, 2015

(30) Foreign Application Priority Data

Jun. 17, 2014 (CN) .......................... 2014 1 0268654

(51) Int. Cl.
| | |
|---|---|
| H01L 27/088 | (2006.01) |
| H01L 29/49 | (2006.01) |
| H01L 21/28 | (2006.01) |
| H01L 21/762 | (2006.01) |
| H01L 21/8234 | (2006.01) |
| H01L 29/66 | (2006.01) |
| H01L 29/78 | (2006.01) |

(52) U.S. Cl.
CPC ..... *H01L 29/4925* (2013.01); *H01L 21/28105* (2013.01); *H01L 21/76224* (2013.01); *H01L 21/823431* (2013.01); *H01L 29/66795* (2013.01); *H01L 29/785* (2013.01)

(58) Field of Classification Search
CPC ..................... H01L 29/66795; H01L 29/785
USPC ......... 257/183, 401; 438/283, 151, 199, 154
See application file for complete search history.

(56) References Cited

U.S. PATENT DOCUMENTS

| | | | |
|---|---|---|---|
| 2005/0175670 A1* | 8/2005 | Aoyagi et al. | 424/426 |
| 2013/0075797 A1* | 3/2013 | Okano | H01L 29/66795 257/288 |
| 2014/0264459 A1* | 9/2014 | Choi | H01L 29/045 257/201 |
| 2015/0035071 A1* | 2/2015 | Ching et al. | 257/369 |

OTHER PUBLICATIONS

Liu et al. "High Performance UTBB FDSOI Devices Featuring 20nm Gate Length for 14nm Node and Beyond," Electronic Devices Meeting IEDM, Dec. 9-11, 2013 *IEEE International*, pp. 9.2.1-9.2.4.

* cited by examiner

*Primary Examiner* — Tan N Tran
(74) *Attorney, Agent, or Firm* — Kilpatrick Townsend & Stockton LLP

(57) ABSTRACT

A semiconductor device includes a semiconductor fin on a substrate. The semiconductor fin includes a stack of alternating layers of first and second materials that induce stress or strain to the channel of the semiconductor device for implementing a strained FinFET. The first and second materials are different. The second material layers include lateral recesses filled with an insulating layer to form an isolated FinFET structure to further induce stress in the channel region to improve the performance of the semiconductor device.

15 Claims, 4 Drawing Sheets

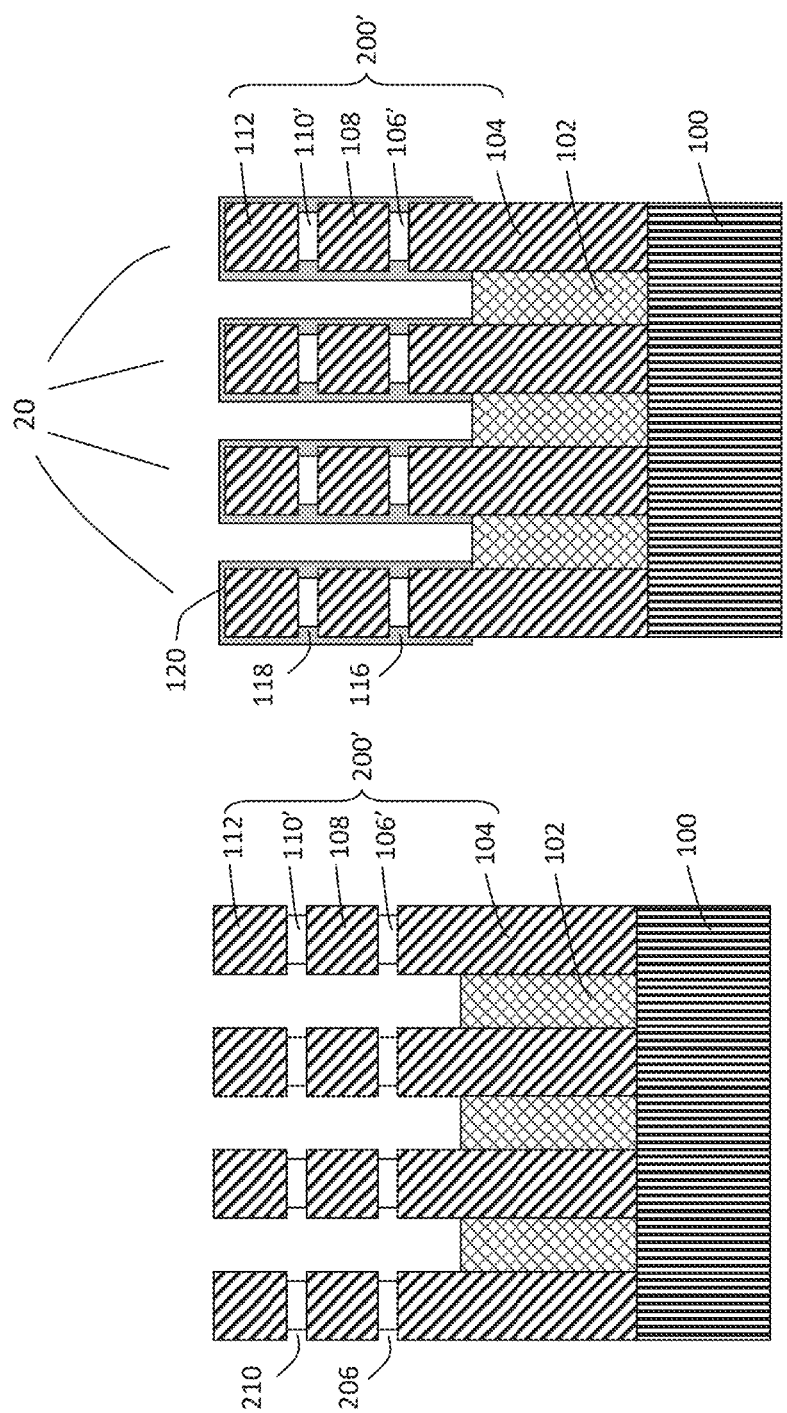

SEGREGATED FINFET STRUCTURE AND MANUFACTURING METHOD

CROSS-REFERENCES TO RELATED APPLICATIONS

This application claims priority to Chinese patent application No. 201410268654.2, filed on Jun. 17, 2014, the content of which is incorporated herein by reference in its entirety.

TECHNICAL FIELD

The present invention relates to a semiconductor structure and a method of manufacturing the same. More particularly, the present invention relates to a strained FinFET that includes a semiconductor fin having a stack of alternating layers of first and second materials to introduce stress into the channel region of the FinFET and a method of manufacturing the same.

BACKGROUND OF THE INVENTION

A strained semiconductor device can have improved characteristics. Thus, it is desirable to generate tensile stress and/or compressive stress in the channel of a semiconductor device to improve its characteristics.

Stress can enhance electron and hole mobility in the channel of a semiconductor device to obtain higher performance of the semiconductor device. Techniques to introduce stress or strain to the channel of a planar device are known. However, a fin-type field effect transistor (FinFET) is a non-planar device. A FinFET is typically a double gate FET in which the channel is a semiconductor "fin" of a certain width and a certain height. The gate dielectric and gate are disposed around the fin. It is difficult to apply stress in the channel of a FinFET device.

In view of the above, there is a need for providing a semiconductor structure including at least one FinFET having a strained channel and a method for fabricating a FinFET device having such semiconductor structure.

BRIEF SUMMARY OF THE INVENTION

It is known in the state of the art that stress can enhance electron and hole mobility in the channel of a FinFET. However, it is difficult to apply stress in the channel of a FinFET device. The inventors discovered that the problems relate to the fin height of the FinFET device that protrudes from the surface of the substrate. For instance, a shallow trench insulating structure can be used to introduce stress to a FET device. In the case of a FinFET, there is a considerable distance between the heterostructure formed by the semiconductor fin and STI structure and the channel, which may affect the strain effect and the implementation of a strained FinFET.

Embodiments of the present invention provide a semiconductor device including at least one FinFET and a method of manufacturing the same. The FinFET includes a semiconductor fin having a laminated structure and a shallow trench structure adjacent to the semiconductor fin. The laminated structure includes a stack of alternating layers of first and second materials.

In an embodiment, a method of manufacturing a semiconductor device is provided. The method includes providing a substrate, forming a semiconductor fin having a laminated structure on the substrate, the laminates structure having alternating first material layers and second material layers, and forming a shallow trench insulation structure adjacent to the semiconductor fin. The first material layers and second material layers comprise different materials.

In another embodiment, a semiconductor device includes a substrate and a semiconductor fin on the substrate. The semiconductor fin includes a stack of alternating first material layers and second material layers. The semiconductor device also includes a shallow trench insulating structure adjacent to the semiconductor fin, lateral recesses in the second material layers, a first insulating layer in the lateral recesses, and a second insulating layer on portions of the semiconductor fin over the top of the shallow trench insulating structure.

The following description together with the accompanying drawings, will provide a better understanding of the nature and advantages of the claimed invention.

BRIEF DESCRIPTION OF THE DRAWINGS

FIG. 8 is a cross-sectional view illustrating a structure after forming lateral recesses in the second material layers of the method of FIG. 4; and FIG. 9 is a cross-sectional view illustrating a structure after forming an insulating layer in the lateral recesses of FIG. 8.

DETAILED DESCRIPTION OF THE INVENTION

Figure 1:
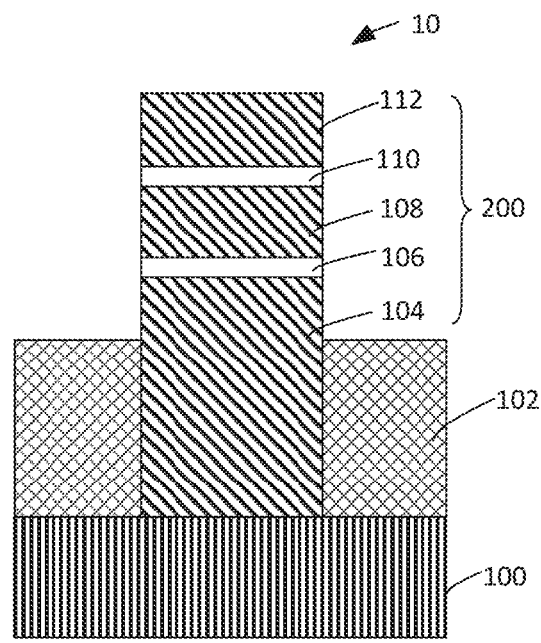
FIG. 1 is a cross-sectional view of a semiconductor device according to an embodiment of the present invention.

The present invention will be described with respect to particular embodiments and with reference to certain drawings but the invention is not limited thereto but only by the claims. Any reference signs in the claims shall not be construed as limiting the scope. The drawings described are only schematic and are nonlimiting. In the drawings, the size of some of the elements may be exaggerated and not drawn on scale for illustrative purposes.

The terms "first," "second," and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

The terms "comprising" is used in the present description and claims, it does not exclude other elements or steps.

Where an indefinite or definite article is used when referring to a singular noun, e.g., "a" or "an", "the", this includes a plural of that noun unless something else is specifically stated.

Various embodiments of the present invention include segregated FinFET structures and methods for manufacturing segregated FinFET structures.

The invention will now further be described by a detailed description of several particular embodiments of the invention. It is clear that other embodiments of the invention can be configured according to the knowledge of persons skilled in the art without departing from the true spirit or technical teaching of the invention.

First Embodiment

FIG. 1 is a cross-sectional view of a semiconductor device 10 according to an embodiment of the present invention. A FinFET will be described as an example. In the embodiment, semiconductor device 10 may be, for example, a pFET. Although semiconductor device 10 is shown as including a single FinFET device in FIG. 1, one of skill in the art would appreciate that semiconductor device 10 may have more than one FinFET device.

Referring to FIG. 1, semiconductor device 10 includes a substrate 100. Substrate 100 may be, for example, a silicon substrate, a silicon-on-insulator (SOI) substrate, or other suitable semiconductor substrate.

Semiconductor device 10 also includes a semiconductor fin 200 disposed on substrate 100. In the embodiment, semiconductor fin 200 may have a laminated structure. As shown in FIG. 1, the laminates structure may include a stack of alternating first material layers 104, 108, 112, and second material layers 106, 110. In the example embodiment shown in FIG. 1, the multi-layered stack has three first material layers and two second material layers overlying substrate 100, but it is understood that the number is arbitrary chosen for describing the example embodiment and should not be limiting.

In the example embodiment, first material layers 104, 108, 112 may be SiGe layers, and second material layers 106, 110 may be Si layers. In the embodiment, the germanium (Ge) concentration (i.e., the ratio of the Ge content to the Ge and Si content) in the SiGe layers of semiconductor fin 200 is in the range between 20 and 50 percent. According to the embodiment, the percentage of the Ge concentration is relatively small, so that it is possible to reduce or eliminate defects to obtain better semiconductor device quality and performance.

In the example embodiment, the first material layers are SiGe layers, and the second material layers are Si layers. It is to be understood by those skilled in the art that other materials can also be used to form the laminated structure. For instance, the first material layers may be SiGe layers, and the second material layers may be Ge layers.

Semiconductor device 10 further includes shallow trench isolations (STI) 102 disposed adjacent to semiconductor fin 200 to provide stress (strain) to the channel region (not shown). As shown, STI 102 are disposed on opposite sides of semiconductor fin 200. In general, as is known in the art, semiconductor fin 200 has a thickness or height greater than that of STI 102. STI 102 may include any suitable materials known in the art, such as oxide, nitride, oxynitride, and the like. As an example, STI 102 may include SiO$_2$.

In addition, semiconductor fin 200 may include source and drain regions (not shown) disposed on opposite sides of the gate structure (not shown) of the FinFET device, as known in the art.

As described in the example embodiment above, semiconductor device 10 is a pFET. In this case, the heterostructure having, for example, multiple layers of SiGe/Si materials stacked one on top another arrangement may induce stress in the channel of the semiconductor device, and a strained FinFET can thus be effectively implemented. It is understood by those of skill in the art that the stress or strain may be caused a lattice constant mismatch in the heterostructure. For example, a channel of pFET semiconductor device 10 may generate tensile stress or compressive stress. Preferably, pFET semiconductor device 10 may be placed under compressive stress, in order to obtain a better performance. As one of the skilled in the art will appreciate, the present invention is equally applicable to nFET semiconductor devices. By using a similar stack arrangement of the semiconductor fin, appropriate tensile stress and/or compressive stress can effectively be generated in the channel of the nFET semiconductor devices.

Second Embodiment

Figure 2:
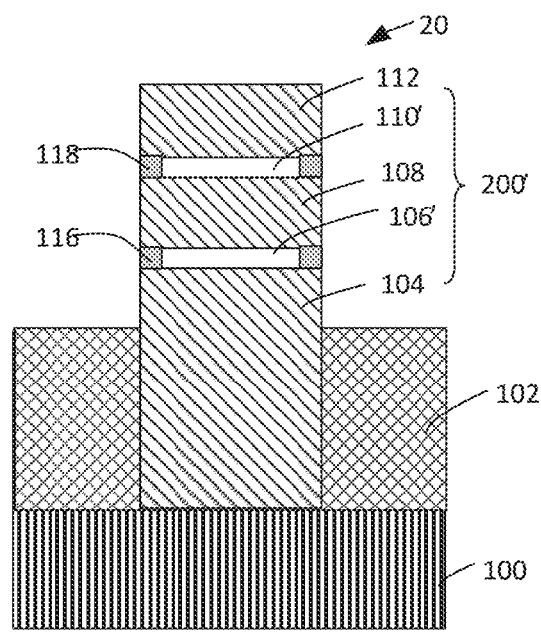
FIG. 2 is a cross-sectional view of a semiconductor device according to another embodiment of the present invention.

FIG. 2 is a cross-sectional view of a semiconductor device 20 according to a second embodiment of the present invention. For the sake of brevity, detailed description of the similar structures as the first embodiment will be omitted, and only differences between the first and second embodiments will be described below.

Referring to FIG. 2, semiconductor device 20 includes a substrate 100 and a semiconductor fin 200' disposed on substrate 100. Semiconductor fin 200' may include a laminated structure. For instance, the laminated structure may include first material layers 104, 108, 112 and second material layers 106', 110' stacked one on top another.

In an exemplary embodiment, first material layers 104, 108, 112 may be SiGe layers, and second material layers 106', 110' may be Si layers.

Similarly, semiconductor device 20 also includes STI 102 adjacently disposed on opposites sides of semiconductor fin 200' to introduce stress (strain) in the channel region.

Referring to FIG. 2, the differences between the first and second embodiments are that second material layers 106' and 110' are laterally recessed with respect to first material layers 104, 108, 112. Further, semiconductor device 20 also includes insulator layers 116, 118 disposed in the spaces formed by the lateral recesses.

Insulator layers 116, 118 may include suitable insulation material known in the art, such as oxide, nitride, oxynitride, and the like. In the example embodiment, insulator layers 116, 118 may include SiO$_2$. It is understood by those skilled in the art, insulator layers 116, 118 may include silicon dioxide and silicon nitride.

Moreover, as described below with reference to FIG. 9, a gate insulator 120 (not shown in FIG. 2) may be formed concurrently with the formation of insulator layers 116, 118. Gate insulator 120 is disposed adjacent to the semiconductor fins 200' and the gate electrodes (not shown), which are disposed above the top of STI 102. Gate insulator 120 covers the top portion of the semiconductor fin 200 that is above the top of STI 102. Insulator layers 116, 118 may have a thickness greater than the thickness of gate insulator 120.

Similarly, through the use of the heterostructure of multiple layers of SiGe/Si stacked on top of another formed in the semiconductor fin and STI structures, stress will be induced in the channel of the semiconductor device, thus enabling an effective implementation of strained FinFET devices. In addition, using the insulator layers 116, 118 formed in the lateral recesses in the second material layers 106' and 110', a segregated FinFET structure is formed to further effectively induce more stress in the channel of the semiconductor device and thereby improve the semiconductor device performance.

Third Embodiment

Figure 3:
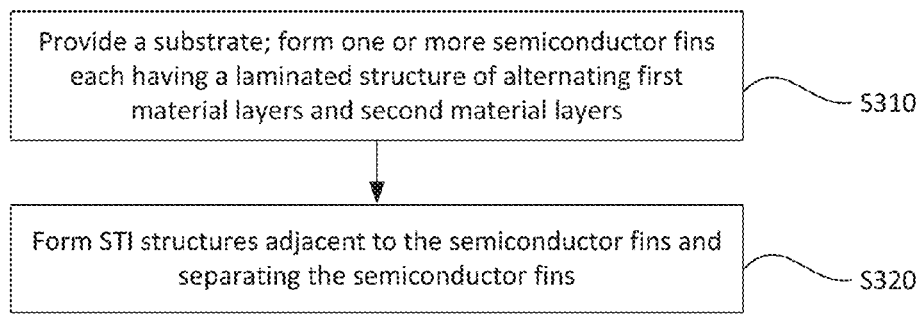
FIG. 3 is a flow chart of a method for manufacturing a semiconductor device according to an embodiment of the present invention.
Figures 5, 6, 7:
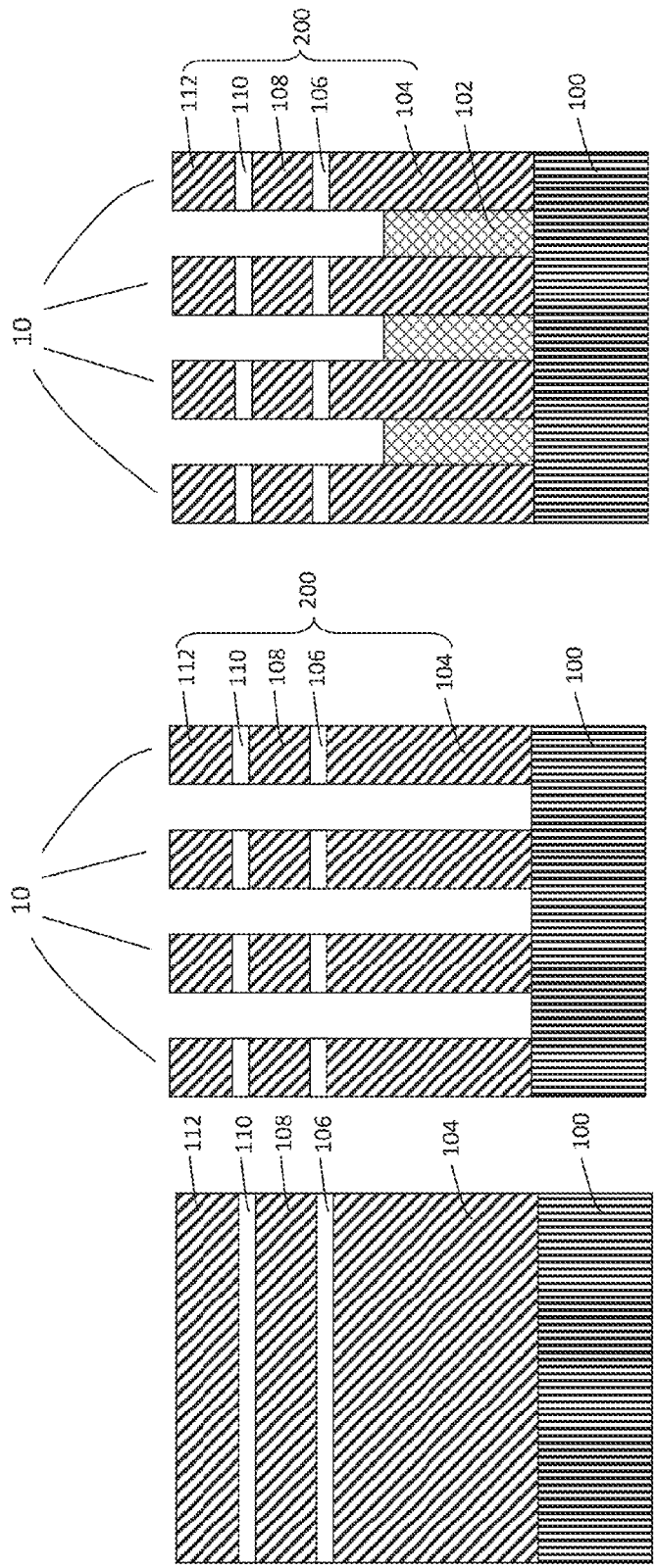
FIG. 5 is a cross-sectional view illustrating a structure of a semiconductor device after forming a stack of alternating layers of first and second materials of the method of FIG. 3.
FIG. 6 is a cross-sectional view illustrating a structure after patterning and etching of the structure of FIG. 5.
FIG. 7 is a cross-sectional view illustrating a structure after forming shallow trench insulating structures in the structure of FIG. 6.

FIG. 3 is a flow chart of a method 300 for fabricating a semiconductor device according to an embodiment of the present invention. Method 300 may be used to fabricate semiconductor device 10 of the first embodiment. FIGS. 5-7 are the corresponding cross-sectional views illustrating intermediate stages obtained by method 300.

Referring to FIG. 3, method 300 may start by providing a substrate 100 and forming at least one semiconductor fin 200 on substrate 100 at block S310. Semiconductor fin 200 includes a laminated structure having alternating first material layers and second material layers. The first material layers have a material that is different from the material of the second material layers. For instance, the laminated layer includes alternating first material layers 104, 108, 112 and second material layers 106, 110.

As shown in FIG. 5, alternating first material layers 104, 108, 112 and second material layers 106, 110 are deposited on substrate 100 at block S310. For example, substrate 100 may be a silicon substrate, a silicon-on-insulator (SOI) substrate, or other suitable semiconductor substrate. First material layers 104, 108, 112 may include silicon germanium (SiGe), and second material layers 106, 110 may include silicon (Si).

First material layers 104, 108, 112 and second material layers 106, 110 may be deposited using conventional chemical vapor deposition processes. For example, ultrahigh vacuum chemical vapor deposition (UHVCVD) processes can be used for deposition of first material layers 104, 108, 112 and second material layers 106, 110. Other conventional deposition processes may be rapid thermal chemical vapor deposition (RTCVD), limited reaction processing CVD (LR-PCVD), molecular beam epitaxy (MBE), and others.

Thereafter, sidewall image transfer techniques may be used to define the semiconductor fins 200. Semiconductor fins 200 can be formed having vertical sidewalls and a narrow width in the first material layers 104, 108, 112 and second material layers 104, 110, using the sidewall image transfer techniques, as shown in FIG. 6. Thereafter, selective etching is performed using a hard mask (not shown) to remove unneeded portions, and source and drain regions (not shown) are formed. The hard mask may include at least one of silicon nitride (SiN), silicon dioxide (SiO2) and silicon oxynitride (SiOxNy). The hard mask may be formed by conventional techniques such as spin coating, CVD, plasma-assisted CVD, rapid thermal chemical vapor deposition (RTCVD), limited reaction processing CVD (LRP-CVD), and other hard mask deposition processes.

Conventional etching process technology can be used for etching. For example, reactive ion etching (RIE), wet etching or dry etching for selectively etching the laminated structure. Thereafter, the hard mask can be removed or retained as a cap layer for the FinFET.

In the embodiment, the Ge concentration of semiconductor fin 200 is in the range between 20 and 50 percent. According to the embodiment, the percentage of Ge concentration is relatively small, so that it is possible to reduce or eliminate defects to obtain better semiconductor device quality and performance.

In the example embodiment, the first material layers are SiGe layers, and the second material layers are Si layers. It will be understood by those skilled in the art that other materials can also be used to form the laminated structure. For instance, the first material layers may be SiGe layers, and the second material layers may be Ge layers.

Method 300 further includes forming shallow trench isolation (STI) structures 102 to induce stress (strain) in the channel region (not shown) at block S320. STI structures 102 may include suitable isolation materials known in the art, such as an oxide, an oxynitride, and the like. For instance, silicon dioxide ($SiO_2$) may be used as the insulation material in the embodiment.

STI structures 102 may be formed using any appropriate deposition processes such as forming a hard mask of a pad nitride on the laminated stack, using lithography based patterning techniques, reactive ion etching (RIE) technique, edge-oxidation technique to form the trenches, depositing a liner on the trenches, etc.

Method 300 may further include forming semiconductor fin 200, source and drain regions (not shown), and gate structure (not shown) disposed on opposite sides of the semiconductor fin 20 to complete the formation of semiconductor device 10.

Method 300 describes process steps for fabricating a pFET semiconductor device 10. In this case, the heterostructure of the SiGe/Si stacked structure of the semiconductor fin and the STI induce stress in the channel, to thereby effectively implement a strained FinFET. For example, a tensile stress or a compressive stress may be generated in the channel of the pFET semiconductor device 10. Preferably, the pFET semiconductor device 10 may be placed under a compressive stress, in order to obtain a better device performance. It will be appreciated by those skilled in the art, that the present invention may also be applied to an nFET semiconductor device. For instance, the stacked structure of the semiconductor fin may also generate a tensile stress and/or a compressive stress in the channel of the nFET semiconductor device.

Fourth Embodiment

Figure 4:
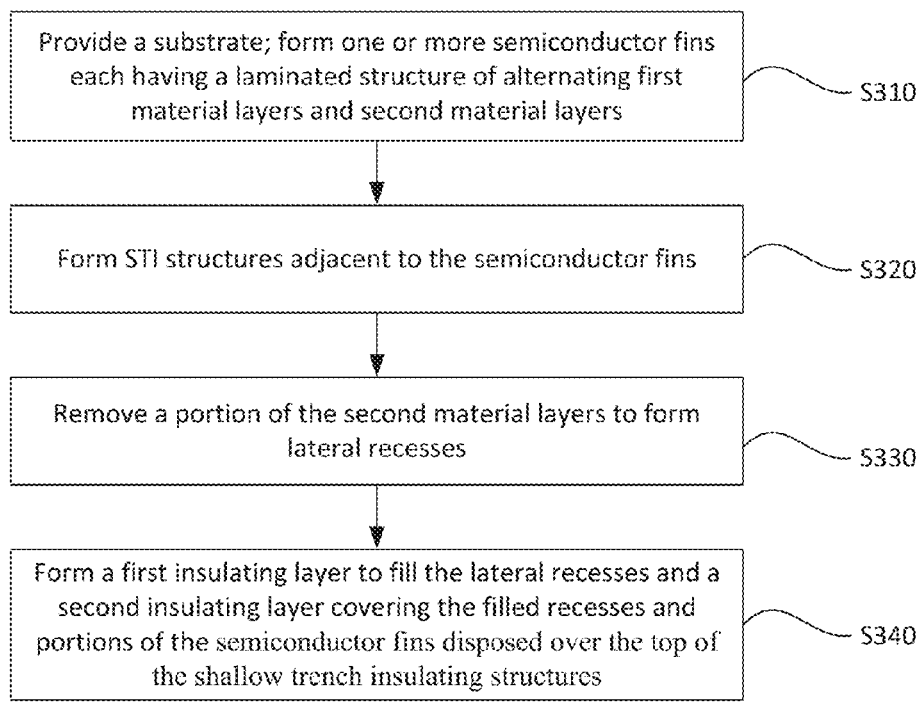
FIG. 4 is a flow chart of a method for manufacturing a semiconductor device according to another embodiment of the present invention.

FIG. 4 is a flow chart of a method 400 for fabricating a semiconductor device according to an embodiment of the present invention. Method 400 may be used to fabricate semiconductor device 20 of the second embodiment. FIGS. 8 and 9 are the corresponding cross-sectional views illustrating intermediate stages obtained by method 400. It is noted that FIGS. 8 and 9 illustrate cross-sectional views that are different from the cross-sectional views shown in FIGS. 5 to 7 associated with the third embodiment. For the sake of brevity and clarity, the description of process steps common to the third and fourth embodiments will not be repeated herein, only the processes that are different from the third embodiment will be described below.

Referring to FIG. 4, method 400 includes blocks S310 and S320 that are similar to method 300. As described above, at block S310 a semiconductor device is provided. The semiconductor device has one or more semiconductor fins formed thereon. The semiconductor fins each comprises a laminated structure having a stack of alternating first material layers 104, 108, 112 and second material layers 106, 110. The first material layers have a material that is different from the material of the second material layers. The semiconductor fins can be formed by alternatively depositing at least one first material layer and at least one second material layer on top of one another to form a stack, and vertically etching the stack to form trenches. At block S320, shallow trench insulation structures 104 can be formed by depositing silicon oxide, nitride to fill a portion of the trenches so that the semiconductor fins are separated and insulated by the STI structures 104.

At block 330, portions of second material layers 106, 110 are removed to form new second material layers 106', 110' that now have lateral recesses 206, 210 relative to first material layers 104, 108, 112. FIG. 8 illustrates a cross-sectional view of the semiconductor device having the newly formed semiconductor fins 200'.

In an exemplary embodiment, block S330 may include selectively removing portions of second material layers 106, 110 using wet etching. Wet etching may include using an alkaline etchant at the temperature of about 70 degrees C. In some embodiments, etchants may include at least one of potassium hydroxide (KOH), propanol, and $K_2Cr_2O_7$. The etchants may include at least one of $NH_4NO_3$ and $NH_4OH$ in some other embodiments.

Method 400 further includes forming insulator layers 116, 118 to fill the lateral recesses 206, 210 in second material layers 106', 110' at block S340.

Insulator layers 116, 118 may include suitable insulating materials known in the art, such as oxide, nitride, oxynitride, and the like. In an exemplary embodiment, $SiO_2$ can be used as an insulating material for insulating layers 116, 118. It is understood by those skilled in the art that insulating layers 116, 118 may use other insulating materials such as silicon dioxide and silicon nitride.

In an embodiment, a gate insulator layer 120 may be concurrently (simultaneously) formed with the formation of insulating layers 116, 118. Gate insulator layer 120 is overlying gate structures (not shown) disposed adjacent to semiconductor fins 200'. In an embodiment, insulating layers 116, 118 have a thickness greater than the thickness of gate insulator layer 120.

Method 400 may further include forming source and drain regions (not shown) in semiconductor fins 200' and gate structures on opposite sides of semiconductor fins 200' (not shown) to complete semiconductor device 20.

Through the heterostructure having the SiGe/Si stack arrangement formed in the semiconductor fins and STI structures, stress may be induced in the channel region of the semiconductor device, to thereby effectively implement a strain FinFET. In addition, through insulating layers 116, 118 formed in the lateral recesses 206, 210 in second material layers 106' and 110', the thus formed isolated FinFET structure can more induce stress in the channel region of the semiconductor device, and further improve its performance.

Although method 400 is shown as including blocks S330 and S340 following block S320, it is to be understood to those of skill in the art that the invention is not limited thereto. For instance, block S320 may be performed after processing blocks S330, S340. That is, STI structures may be formed after the formation of the insulation layer on the semiconductor fins.

Embodiments of the present invention provide a method of manufacturing a semiconductor device that includes forming at least one semiconductor fin on a substrate. The semiconductor fin includes a laminated structure having a stack of alternating first material layers and second material layers. The first material layers and the second material layers have different materials. The method further includes forming trenches in the laminated structure and filling the trenches with a dielectric material to form shallow trench isolation (STI) structures. In certain embodiments, the method also includes selectively removing portions of the second material layers to obtain lateral recesses so that the second material layers have a width that is smaller than the width of the first material layers. The method also includes forming an insulating layer filling the lateral recesses. In some embodiments, the insulating layer also covers portions of the semiconductor fin that are disposed on the top of the shallow insulation isolation structures. The insulating layer has a thickness disposed in the lateral recesses greater than the thickness of the insulating layer covering the portions of the semiconductor fin disposed on the top of the shallow trench isolation structures.

Embodiments of the present invention also provide a semiconductor device having a substrate and a semiconductor fin disposed on the substrate. The semiconductor fin has a laminated structure that includes a stack of alternating first material layers and second material layers. The first material layers and the second material layers have different materials. In an embodiment, the first material layers comprise silicon germanium (SiGe), and the second material layers comprise silicon (Si). In another embodiment, the first material layers comprise silicon germanium (SiGe), and the second material layers comprise germanium (Ge). In certain embodiments, the germanium (Ge) concentration in the first material layers is in a range between 20 and 50 percent. The Ge concentration is defined as the ratio of the Ge content to the Ge and Si (SiGe) content.

In another embodiment, a semiconductor device includes a substrate and a semiconductor fin disposed on the substrate. The semiconductor fin has a laminated structure including a stack of alternating first material layers and second material layers. The first material layers and second material layers have different materials. The semiconductor device also includes a shallow trench insulating structure that is disposed on opposite sides of the semiconductor fin. The semiconductor device further includes lateral recesses in the second material layers so that the second material layers have a smaller width with respect to the width of the first material layers. In addition, the semiconductor device includes a first insulating layer filling the lateral recesses and a second insulating layer covering portions of the semiconductor fin disposed over the top of the shallow trench insulating structure. The first insulating layer has a thickness greater than the thickness of the second insulating layer.

While the invention has been described in terms of various specific embodiments, those of skill in the art will recognize that many modifications can be made to adapt to a particular application or material to the teachings of the invention. For example, the above-described embodiments may be used in combination with each other. Therefore, the appended claims should be construed broadly to include variants and embodiments of the invention.

What is claimed is:

1. A method of manufacturing a semiconductor device comprising:

providing a substrate;

forming a semiconductor fin having a laminated structure on the substrate, the laminated structure having a stack of alternating first material layers and second material layers;

forming a shallow trench insulation structure on opposite sides of the semiconductor fin;

selectively removing portions of the second material layers to obtain lateral recesses with respect to the first material layers; and forming an insulating layer filling the lateral recesses and directly on an upper surface and side surfaces of the semiconductor fin protruding over a surface of the shallow trench insulation structure as a gate insulation layer, wherein the insulating layer filling the lateral recesses has a thickness greater than a thickness of the gate insulating layer.

2. The method of claim 1, wherein the first material layers comprise SiGe layers and the second material layers comprise Si layers.

3. The method of claim 2, wherein the first material layers comprises a concentration of Ge in a range between 20 and 50 percent.

4. The method of claim 1, wherein the first material layers comprise SiGe layers and the second material layers comprise Ge layers.

5. The method of claim 1, wherein the substrate is a silicon substrate or a silicon-on-insulator (SOI) substrate.

6. The method of claim 1, wherein forming the semiconductor fin comprises:

alternatively depositing at least one first material layer and at least one second material layer; and patterning and etching the laminated structure to form the semiconductor fin.

7. The method of claim 1, wherein the semiconductor device is a FinFET having a tensile stress or a compressive stress.

8. The method of claim 1, wherein selectively removing comprises a wet etching.

9. The method of claim 8, wherein the wet etching is performed at a temperature at about 70 degrees C. using an alkaline etchant.

10. The method of claim 9, wherein the alkaline etchant comprises at least one of KOH, propanol, and $K_2Cr_2O_7$, or at least one of $NH_4NO_3$ and $NH_4OH$.

11. A semiconductor device comprising:

a substrate;

a semiconductor fin on the substrate, the semiconductor fin having a stack of alternating first material layers and second material layers, the second material layers comprising lateral recesses with respect to the first material layers;

a shallow trench insulating structure disposed on opposite sides of the semiconductor fin; and an insulating layer filling the lateral recesses and directly on an upper surface and side surfaces of the semiconductor fin protruding over a surface of the shallow trench insulation structure as a gate insulation layer, wherein the insulating layer filling the lateral recesses has a thickness greater than a thickness of the gate insulating layer.

12. The semiconductor device of claim 11, wherein the first material layers comprise SiGe layers and the second material layers comprise Si layers.

13. The semiconductor device of claim 12, wherein the first material layers comprise a concentration of Ge in a range between 20 and 50 percent.

14. The semiconductor device of claim 11, wherein the first material layers comprise SiGe layers and the second material layers comprise Ge layers.

15. The semiconductor device of claim 11, wherein the semiconductor device is a FinFET having a tensile stress or a compressive stress.

* * * * *